United States Patent
Houng et al.

(10) Patent No.: US 11,837,484 B2
(45) Date of Patent: Dec. 5, 2023

(54) ROBOT ARM DEVICE AND METHOD FOR TRANSFERRING WAFER

(71) Applicant: TAIWAN SEMICONDUCTOR MANUFACTURING CO., LTD., Hsinchu (TW)

(72) Inventors: Wei-Hua Houng, Hsinchu (TW); Che-Fu Chen, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 89 days.

(21) Appl. No.: 17/228,204

(22) Filed: Apr. 12, 2021

(65) Prior Publication Data

US 2021/0233788 A1 Jul. 29, 2021

Related U.S. Application Data

(62) Division of application No. 16/414,571, filed on May 16, 2019, now Pat. No. 11,004,713.

(51) Int. Cl.
| | |
|---|---|
| *H01L 21/677* | (2006.01) |
| *H01L 21/687* | (2006.01) |
| *G01N 29/04* | (2006.01) |
| *H01L 21/66* | (2006.01) |

(52) U.S. Cl.
CPC ....... *H01L 21/67706* (2013.01); *G01N 29/04* (2013.01); *H01L 21/68707* (2013.01); *H01L 22/10* (2013.01)

(58) Field of Classification Search
CPC ......... H01L 21/68707; H01L 21/67706; H01L 22/10
See application file for complete search history.

(56) References Cited

U.S. PATENT DOCUMENTS

| | | | |
|---|---|---|---|
| 9,810,532 B2 | 11/2017 | Hashimoto et al. | |
| 9,972,523 B2 | 5/2018 | Hashimoto | |
| 9,978,631 B2 | 5/2018 | Xu | |
| 10,056,282 B2 | 8/2018 | Xu | |
| 10,115,588 B2 | 10/2018 | Hashimoto et al. | |
| 10,134,620 B2 | 11/2018 | Katsuda et al. | |
| 10,354,903 B2 | 7/2019 | Sakata et al. | |
| 10,607,879 B2 * | 3/2020 | Cavins | H01L 21/67778 |
| 2007/0029227 A1 | 2/2007 | Bonora | |
| 2008/0159832 A1 | 7/2008 | Mitsuyoshi | |
| 2012/0290124 A1 | 11/2012 | Kimura | |
| 2015/0174763 A1 | 6/2015 | Kimura et al. | |
| 2017/0194183 A1 * | 7/2017 | Xu | B25J 9/1692 |
| 2019/0344446 A1 | 11/2019 | Goto et al. | |
| 2020/0020558 A1 * | 1/2020 | Liao | H01L 21/67766 |
| 2020/0098604 A1 * | 3/2020 | Sugimoto | H01L 21/67265 |
| 2020/0206917 A1 * | 7/2020 | Yoshida | G05B 19/42 |
| 2020/0286752 A1 | 9/2020 | Toyomaki et al. | |
| 2020/0365436 A1 * | 11/2020 | Houng | G01N 29/225 |

(Continued)

FOREIGN PATENT DOCUMENTS

CN 112447563 A * 3/2021 ....... H01L 21/68707

*Primary Examiner* — Kaitlin S Joerger

(74) *Attorney, Agent, or Firm* — Maschoff Brennan

(57) ABSTRACT

A method includes positioning an end effector at a height lower than a height of a wafer. The end effector is moved to a position under the wafer. A wafer backside property of the wafer is detected by using a sensor on the end effector. The wafer backside property is analyzed to obtain an analysis result.

20 Claims, 13 Drawing Sheets

(56) References Cited

U.S. PATENT DOCUMENTS

2020/0411348 A1* 12/2020 Yoshida ............ H01L 21/67778
2021/0402607 A1* 12/2021 Pavlik ............... H01L 21/67778
2022/0063109 A1*  3/2022 Pavlik ............... H01L 21/67303

* cited by examiner

ROBOT ARM DEVICE AND METHOD FOR TRANSFERRING WAFER

RELATED APPLICATIONS

This application is a divisional application of U.S. patent application Ser. No. 16/414,571, filed May 16, 2019, which is herein incorporated by reference in their entirety.

BACKGROUND

In a wafer manufacturing process, the wafers need to be processed multiple times at different process chambers. Robot arms are used for transferring the wafers between the process chambers. If the process chambers are far apart, another solution for transporting the wafers is needed. Instead of using the robot arm to transfer the wafers directly from one process chamber to another, front opening unified pods can be used as an intermediate means for transferring wafers in the wafer manufacturing processes. The robot arms can transfer the wafers between the front opening unified pods and the process chambers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
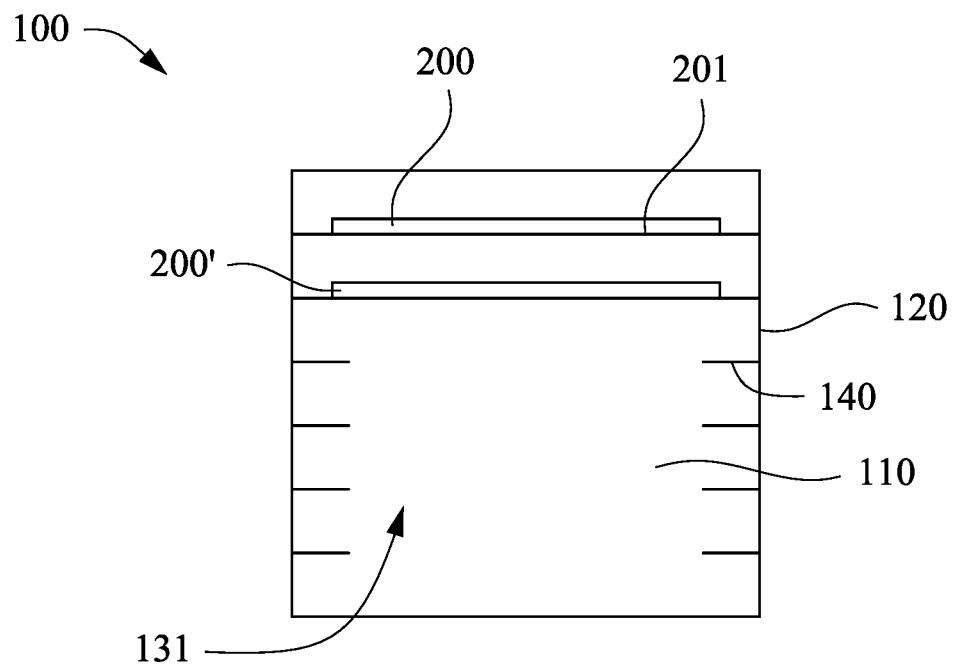
FIG. 1 shows a schematic diagram of front opening unified pod according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments of the present disclosure, wafers are accommodated and transferred in units called front opening unified pods (FOUP). FIG. 1 shows a front opening unified pod 100 according to some embodiments of the present disclosure. The front opening unified pod 100 has a back wall 110, two side walls 120, a front opening 131, and a front door for optionally covering the front opening 131. A plurality of fin supports 140 are formed on the inner side of each of the side walls 120 of the front opening unified pod 100. A wafer 200 can be held by two fin supports 140 arranged respectively on the two side walls 120.

Figure 2A:
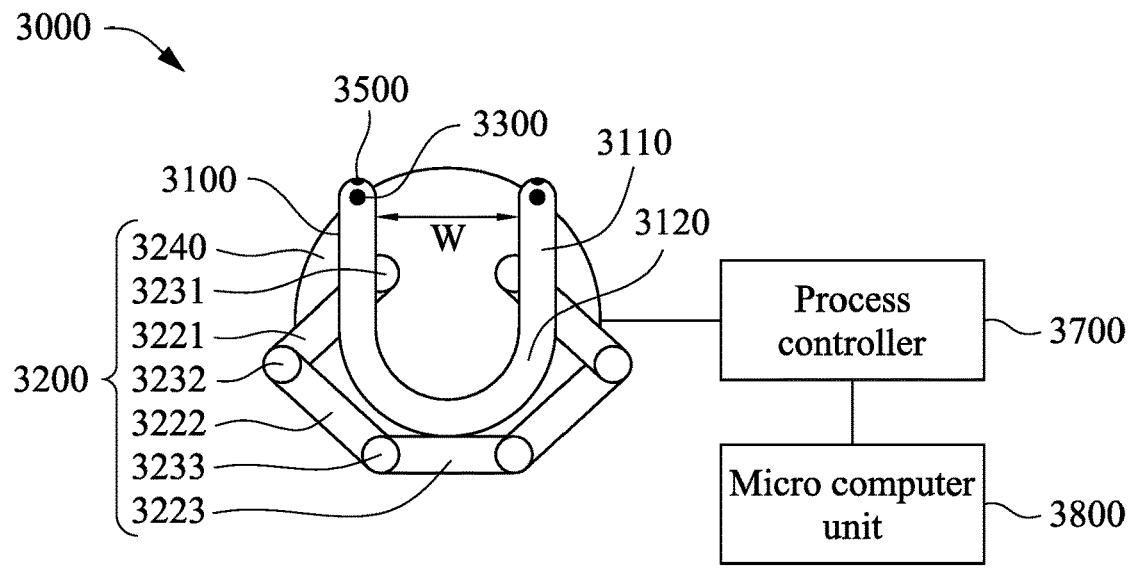
FIGS. 2A and 2B show schematic diagrams of a robot arm device according to some embodiments of the present disclosure.

In some embodiments of the present disclosure, the wafer 200 inside the front opening unified pod 100 can be accessed, through the front opening 131 of the front opening unified pod 100, by a robot arm device. Referring to FIG. 2A, the robot arm device 3000 has an end effector 3100 and a transmission system 3200. The end effector 3100 has two finger portions 3110 and a top surface 3120. A width W of the end effector 3100 is less than a distance between the fin supports 140 on the two side walls 120 of the front opening unified pod 100, such that the end effector 3100 can lift the wafer 200 held by the fin supports 140 without contacting said fin supports 140. The finger portions 3110 are configured to hold and lift the wafer 200 at the top surface 3120 of the end effector 3100.

Figure 2B:
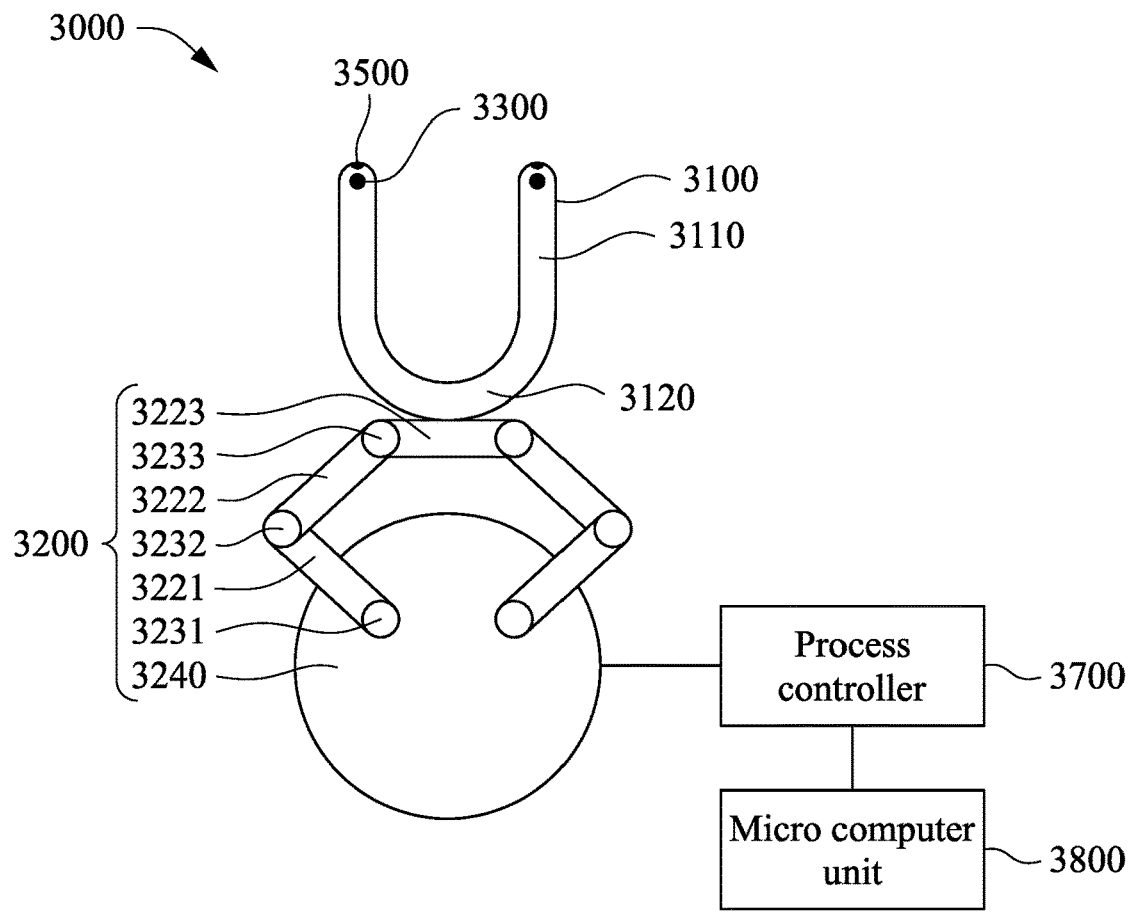

The end effector 3100 is attached to and driven by the transmission system 3200. The transmission system 3200 includes a rotation unit 3240 and a plurality of transmission arms 3221, 3222, 3223. Two first level transmission arms 3221 are rotatably connected to the rotation unit 3240 at two first level joints 3231, respectively. Two second level transmission arms 3222 are rotatably connected to the two first level transmission arms 3221 at two second level joints 3232, respectively. A third level transmission arm 3223 is rotatably connected to the two second level transmission arms 3222 at two third level joints 3233, respectively. The end effector 3100 is attached to the third level transmission arm 3223. As shown in FIG. 2B, if the first level transmission arms 3221 rotate about the first level joints 3231 toward the front, and the second level transmission arms 3222 rotate about the second level joints 3232 toward the front, then the third level transmission arm 3223 moves toward the front in a translational motion, thereby moving the end effector 3100 forward. Conversely, if the first level transmission arms 3221 rotate backward about the first level joints 3231, and the second level transmission arms 3222 rotate backward about the second level joints 3232, then the third level transmission arm 3223 moves backward in a translational motion, thereby moving the end effector 3100 backward. Thusly, by the coordinated rotations of the transmission arms 3221, 3222, 3223 about their respective joints 3231, 3232, 3233, the end effector 3100 can be moved forward and backward in a linear motion, thereby moving the end effector 3100 into and out of the front opening unified pod 100. Stated differently, the end effector 3100 is mechanically dependent on a motion of the transmission system 3200.

Once inside the front opening unified pod 100, the end effector 3100 can lift the wafer 200. Specifically, the top surface 3120 of the end effector 3100 of the robot arm device 3000 can contact the bottom side (backside 201) of the wafer 200 in the space between the two fin supports 140 supporting the wafer 200, and then raise the wafer 200 until the wafer 200 is lifted from the fin supports 140.

As shown in FIG. 2A, in some embodiments of the present disclosure, the robot arm device 3000 further includes a front sensor 3500 arranged at the front of the end effector 3100. The front sensor 3500 is configured to detect the distance between the front sensor 3500 and an object in front of the end effector 3100.

Figure 3:
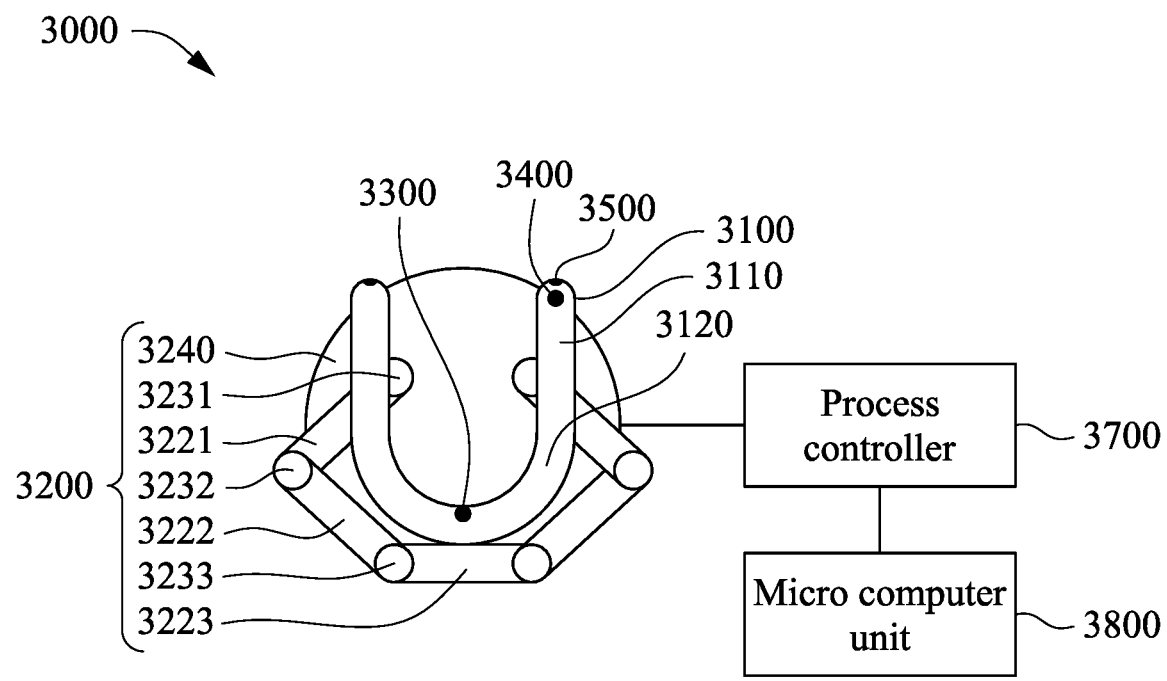
FIG. 3 show a schematic diagram of a robot arm device according to some embodiments of the present disclosure.

Referring to FIG. 2A and FIG. 3, in some embodiments of the present disclosure the robot arm device further includes a top sensor 3300. As shown in FIG. 2A, in some embodiments the top sensor 3300 include two image cameras arranged on the top surface 3120 of the end effector 3100. The two image cameras are configured to capture a wafer image. In some embodiments, the image cameras are arranged respectively on the two finger portions 3110, such that when the end effector 3100 is moved into the front opening unified pod 100, the image cameras are positioned proximal to a central portion of the backside 201 of the wafer 200 and are able to capture complete images of the backside 201 of the wafer 200.

As shown in FIG. 3, in some embodiments of the present disclosure, the top sensor 3300 is a distance detector arranged on the top surface 3120 of the end effector 3100. The distance detector is configured to detect distances between the distance detector and a plurality of points on an object which the top surface 3120 of the end effector 3100 faces, such as the backside 201 of the wafer 200 when the end effector 3100 is positioned inside the front opening unified pod 100.

In some embodiments of the present disclosure, the top sensor 3300 is an acoustic detector arranged at the top surface 3120 of the end effector 3100, and is configured to detect sound waves generated by vibrations of the wafer 200. As shown in FIG. 3, in some embodiments of the present disclosure, the robot arm device 3000 further includes a sound wave generator 3400. The sound wave generator 3400 is configured to generate sound waves. The acoustic detector is arranged at the top surface 3120 of the end effector 3100, and is configured to detect the sound waves generated by the sound wave generator 3400 after they have been reflected by an object which the top surface 3120 of the end effector 3100 faces, such as the backside 201 of the wafer 200 when the end effector 3100 is positioned inside the front opening unified pod 100.

Figure 5:
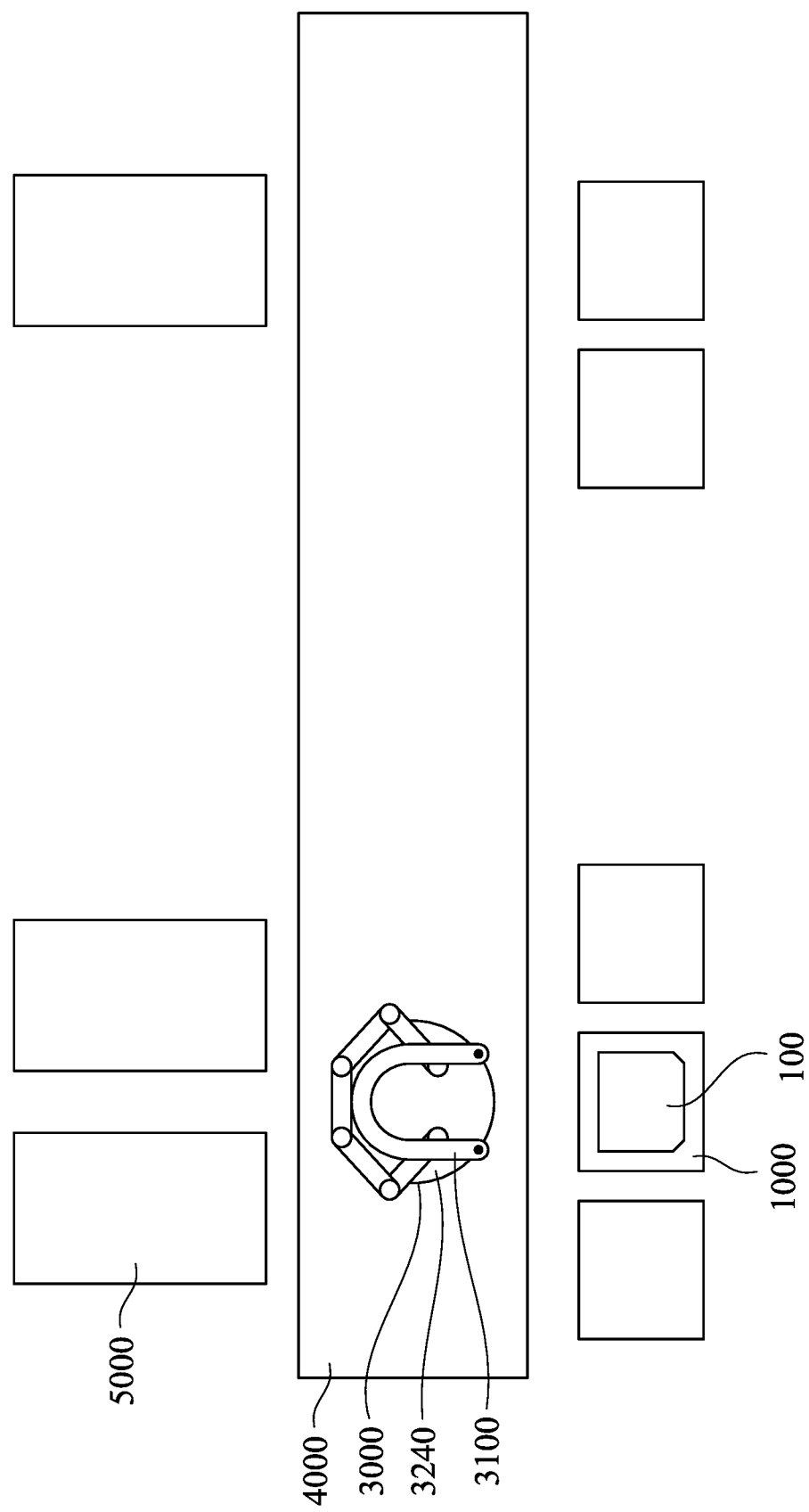
FIG. 5 shows a schematic diagram of a robot arm device, a transportation line, front opening unified pods, and process chambers according to some embodiments of the present disclosure.

Referring again to FIG. 2A, in some embodiments of the present disclosure, the robot arm device 3000 includes a process controller 3700 for controlling the robot arm device 3000. In some embodiments, the process controller 3700 is configured to control the transmission system 3200 to move the end effector 3100 and the top sensor 3300 thereon to a position inside the front opening unified pod 100, such that the top sensor 3300 can detect a wafer backside property. As a result, the top sensor 3300 can be interchangeably referred to as a wafer backside sensor in this context. In some embodiments, the process controller 3700 is configured to control the transmission system 3200 to move the end effector 3100 to a position at a certain height and in front of the front opening unified pod 100, such that the front sensor 3500 can detect if a wafer 200 is in front of the end effector 3100 at that particular height. In some embodiments, if a particular wafer 200 is to be transferred from the front opening unified pod 100 to a process chamber (e.g., the process chamber 5000 as shown in FIG. 5), the process controller 3700 is configured to position the end effector 3100 at the height corresponding to the height of the wafer 200 inside the front opening unified pod 100, based on the height assigned to the wafer by a method for determining wafer heights, to be further described below.

Referring again to FIG. 2A, in some embodiments of the present disclosure, the robot arm device 3000 includes a micro computer unit 3800 configured to analyze a wafer backside property and obtain an analysis result. The wafer backside property can be detected by the top sensor 3300 and sent to the micro computer unit 3800 by the process controller 3700. The wafer backside property can be wafer backside images detected by the image cameras, wafer-to-end effector distances detected by the distance detector, or sound waves reflected by the wafer backside and detected by the acoustic detector. In some embodiments, if the micro computer unit 3800 obtains an anomalous analysis result after analyzing the wafer backside property, then the process controller 3700 is configured to report an alarm signal (e.g., a voice signal or an image signal for notifying a user of the robot arm device 3000). If the micro computer unit 3800 does not obtain an anomalous analysis result, then the process controller 3700 is configured to transfer the wafer 200 to a process chamber (e.g., the process chamber 5000 as shown in FIG. 5).

In some embodiments, the micro computer unit 3800 is configured to analyze the wafer backside property by using a predetermined algorithm. In some embodiments, the predetermined algorithm is a set of explicit instructions input by human. In some embodiments, the predetermined algorithm is obtained by machine learning.

Figure 4:
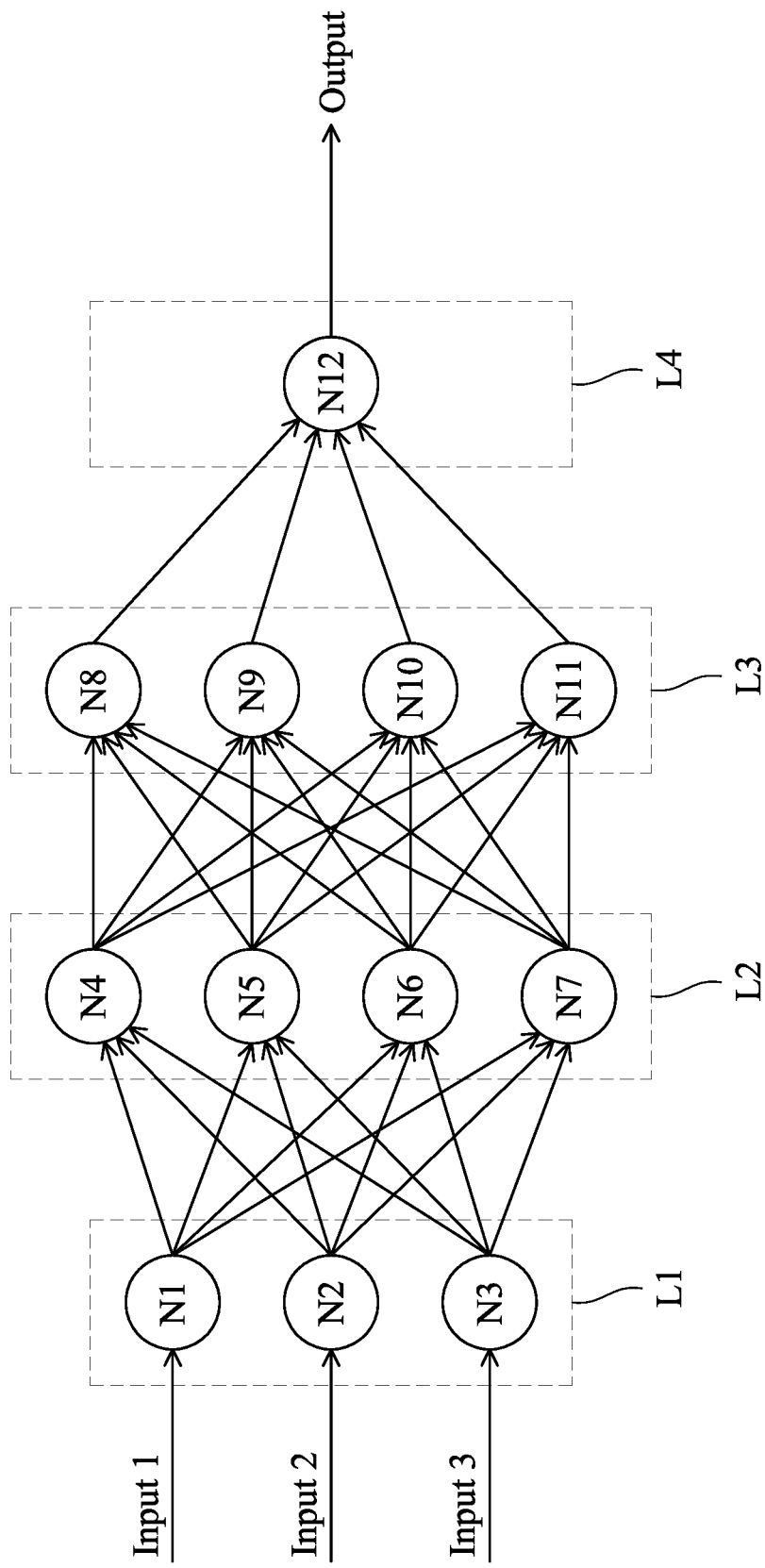
FIG. 4 shows a schematic diagram of a neural network according to some embodiments of the present disclosure.

Machine learning identifies commonalities in data and reacts based on the presence or absence of such commonalities in each new piece of data. An artificial neural network is used. The artificial neural network itself is not an algorithm, but rather a framework for many different machine learning algorithms to work together and process complex data inputs. Such systems learn to perform tasks by considering examples, generally without being programmed with any task-specific rules. Referring to FIG. 4, the artificial neural network has a collection of connected nodes N1 . . . N12. Each connection can transmit information or a signal from one node Ni to another Ni. An artificial node Ni that receives a signal can process it and then signal additional artificial node Ni connected to it. In some embodiments, the signal at a connection between the artificial nodes Ni is a real number, and the output of each artificial node is computed by some non-linear function of the sum of its inputs. The connections between the artificial nodes Ni are edges. In some embodiments, the artificial nodes Ni and the edges have a weight that adjusts as learning proceeds. The weight increases or decreases the strength of the signal at a connection. The artificial nodes N1 . . . N12 each may have a threshold such that the signal is only sent if the aggregate signal crosses that threshold. In some embodiments, the artificial nodes Ni are grouped into layers L1, L2, L3, L4. Each node of a layer can send output signals to all nodes of another layer, which receive these signals as inputs. As shown in FIG. 4, the nodes 4, 5, 6, 7 of the layer L2 each send output signals via edges to the nodes 8, 9, 10, 11 of the layer L3. Different layers can perform different kinds of transformations on their inputs. Signals travel from the first layer (the input layer L1) to the last layer (the output layer L4), possibly after passing through a plurality of hidden layers L2, L3.

Referring back to FIG. 3, outside the front opening unified pod 100, the robot arm device 3000 can be rotated by the rotation unit 3240 so as to adjust the transmission system 3200 and the end effector 3100 to face different directions. In some embodiments of the present disclosure, the robot arm device 3000 is configured to transfer wafers 200 between front opening unified pods 100 and process chambers. Referring to FIG. 5, the robot arm device 3000 is arranged on a transportation line 4000 and movable between two ends thereof, and the rotation unit 3240 can rotate the robot arm device 3000 and the end effector 3100 thereof to face any of the front opening unified pods 100 stationed at load ports 1000 or any of the process chambers 5000. When the robot arm device 3000 is positioned in front of one of the front opening unified pods 100 or one of the process chambers 5000, the rotation unit 3240 can rotate such that the end effector 3100 of the robot arm device 3000 faces said front opening unified pod 100 or process chamber 5000, and the transmission arms of the robot arm device 3000 can drive the end effector 3100 to move into and out of the front opening unified pod 100 or the process chamber 5000, by rotating the transmission arms about the respective joints as mentioned above.

Figure 6A:
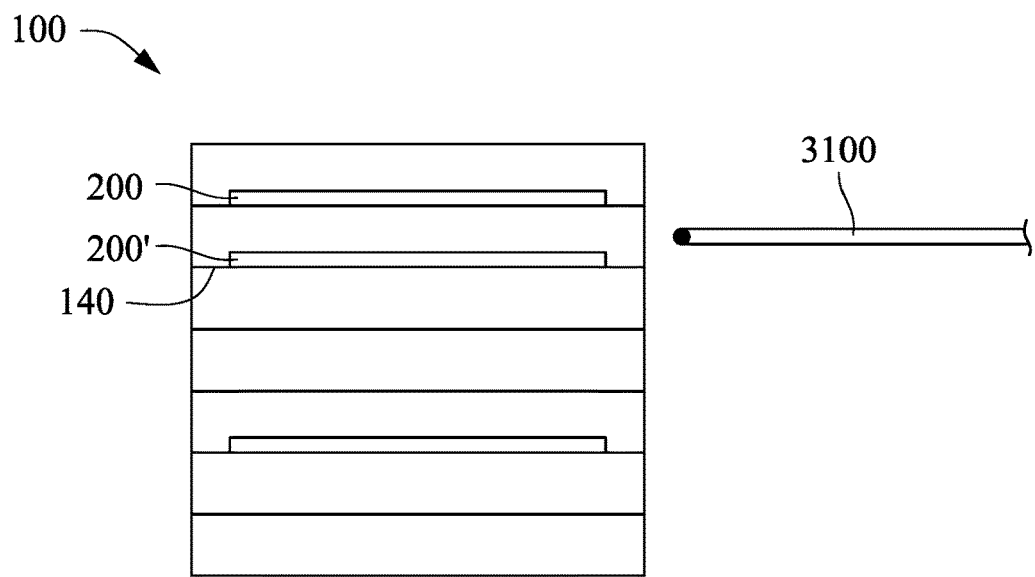
FIGS. 6A, 6B, 6C, and 6D show schematic diagrams of a robot arm device retrieving a wafer from a front opening unified pod according to some embodiments of the present disclosure.
Figure 6B:
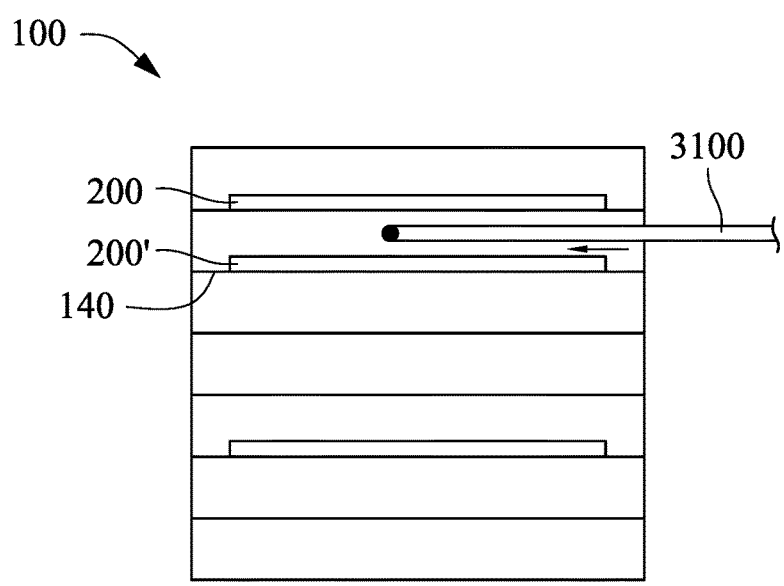
Figure 6C:
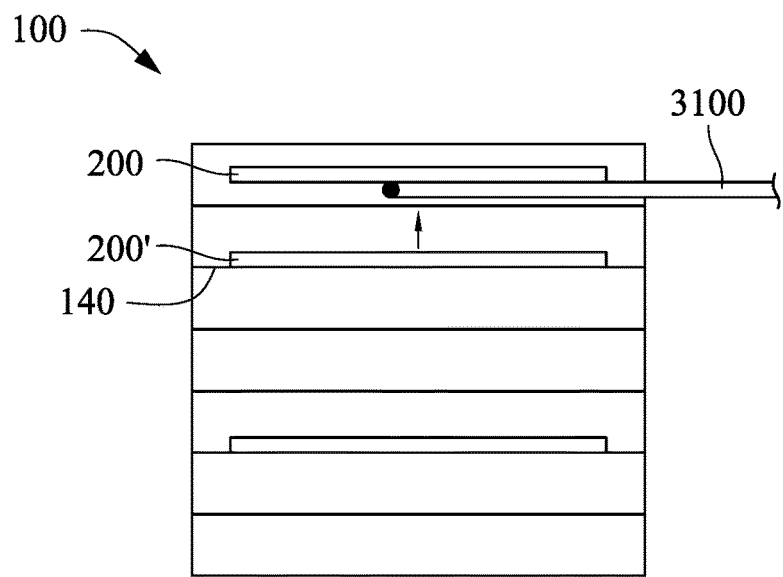
Figure 6D:
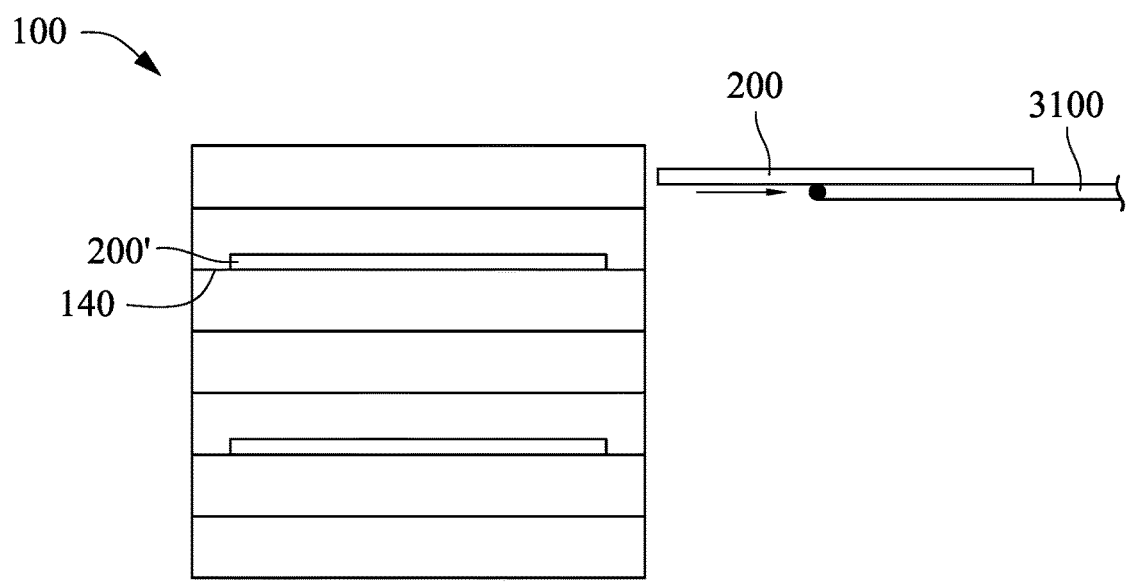

Reference is now made to FIGS. 6A-6D. In order to retrieve and transfer a wafer 200 from the front opening unified pod 100, the end effector 3100 is inserted into the gap between said wafer 200 and a wafer 200' directly under said wafer 200, moved upward to contact and lift the wafer 200 from the fin supports 140 holding the wafer 200, and then transfers the wafer 200 out of the front opening unified pod 100. This requires that the height of the wafer 200 and the wafer 200' thereunder is known, such that the end effector 3100 can be positioned at an appropriate height (a height between the heights of the wafer 200 and the wafer 200') before moving into the gap between the wafer 200 and the wafer 200'. FIG. 6A illustrates that the end effector 3100 is lowered to a position between assigned heights of the wafers 200 and 200' (corresponding to the heights of the fin supporters 140 supporting said wafers 200 and 200'), FIG. 6B illustrates horizontally moving the end effector into the FOUP 100 at the height between assigned heights of the wafers 200 and 200' (or of the corresponding fin supporters 140), and FIG. 6C illustrates lifting the end effector 3100 to lift the wafer 200, and FIG. 6D illustrates moving the end effector 3100 to retrieve the wafer 200 from the FOUP 100.

To increase the efficiency of the wafer transfer process, wafers 200 are stored as compactly as possible in the front opening unified pod 100 such that as many wafers 200 as possible are stored and transported by the front opening unified pod 100. In other words, the fin supports 140 on each of the side walls 120 are spaced apart at short distances. Wafers 200 arranged on the fin supports 140 therefore are spaced apart at short distances with small gaps between them. Consequently, the robot arm device 3000 has a small margin of error for positioning the end effector 3100 at an appropriate height when being inserted into the front opening unified pod 100. If the end effector 3100 is positioned at a height that is too high, the end effector 3100 may impact the wafer 200 when attempting to move into the front opening unified pod 100. Similarly, if the end effector 3100 is positioned at a height that is too low, the end effector 3100 may impact the wafer 200' under the wafer 200 when attempting to move into the front opening unified pod 100. When attempting to move into the front opening unified pod 100, if the end effector 3100 accidentally impacts one of the wafers 200, 200' inside the front opening unified pod 100, the entire front opening unified pod 100 may tilt over and fall, and the wafers 200 accommodated therein may break. Therefore, being able to correctly and accurately identify the height of each wafer 200 in the front opening unified pod 100 is important.

In some embodiments of the present disclosure, the same end effector 3100 used for transferring the wafers 200 in the front opening unified pod 100 is used for identifying the respective heights of the wafers 200. Referring to FIGS. 7A, 7B, 7C, and 7D the front sensor 3500 is arranged at the front of the end effector 3100 of the robot arm device, and is configured to detect an object distance OD which is the distance between the front sensor 3500 and an object in front of the front sensor 3500. If the object distance at a particular height is less than a predetermined distance PD, then a corresponding action can be taken, such as assigning said height to the object in front of the front sensor 3500.

Figure 7A:
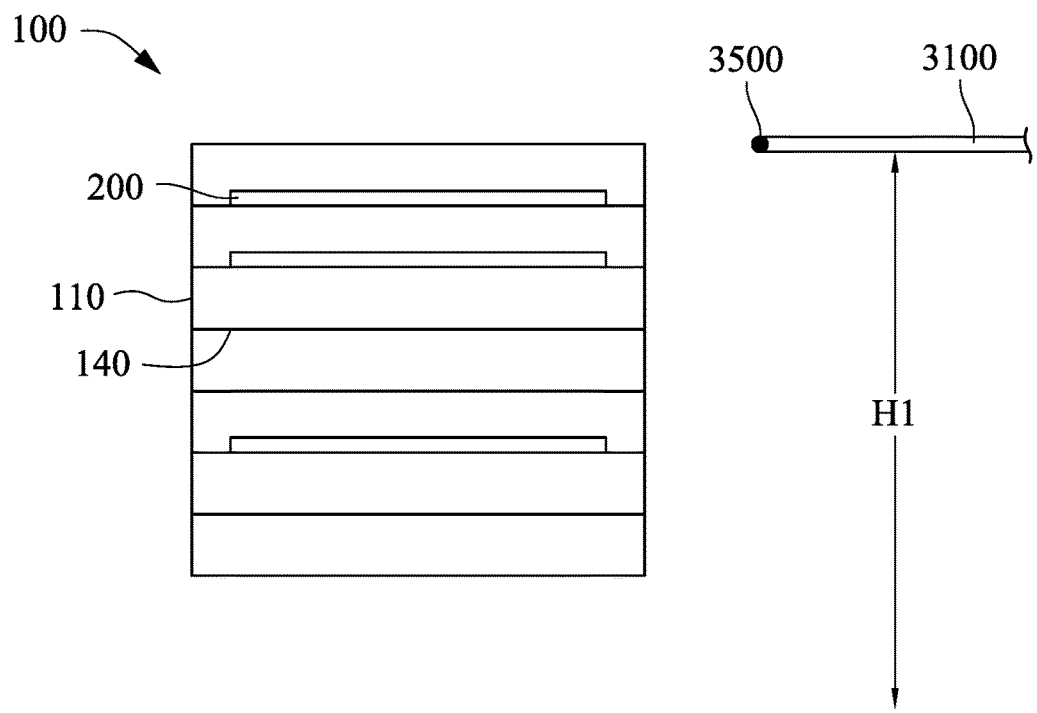
FIGS. 7A, 7B, 7C, and 7D show schematic diagrams of a robot arm device determining a height to wafer in a front opening unified pod according to some embodiments of the present disclosure.
Figure 7B:
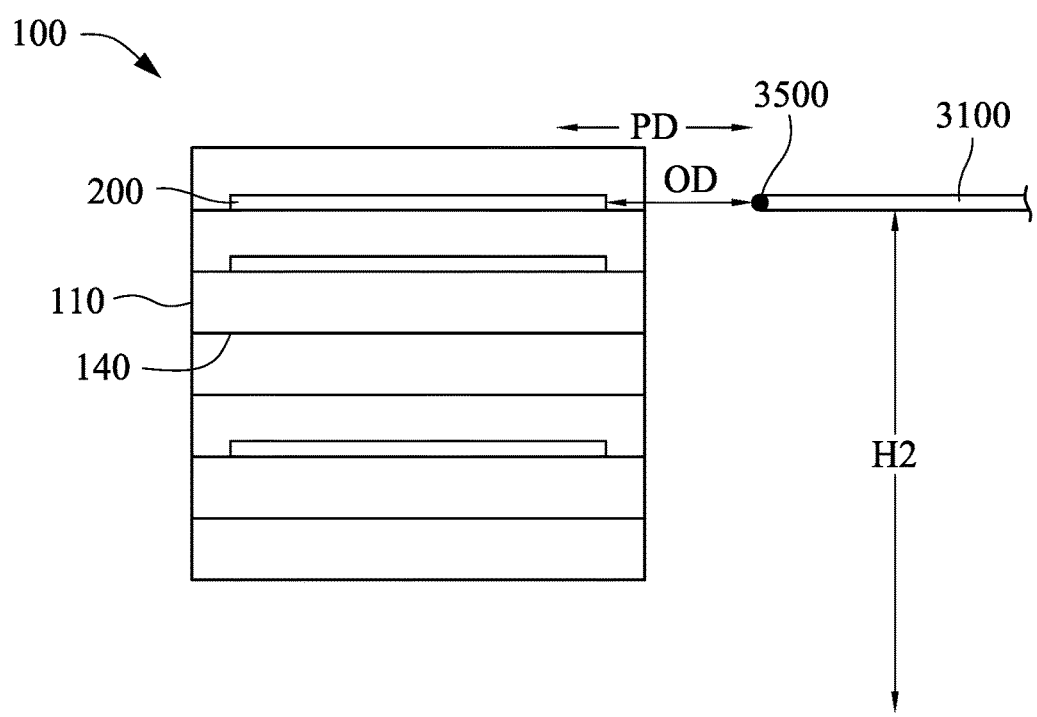

In some embodiments, as shown in FIG. 7B, the predetermined distance PD is greater than the distance between the front sensor 3500 disposed on the end effector 3100 and the wafer 200 stored in the front opening unified pod 100. When the front sensor 3500 is at the same height H2 as the wafer 200, the object distance OD is less than the predetermined distance PD, and said height H2 is assigned to the wafer 200. If the predetermined distance is less than the distance between the front sensor 3500 and the wafer 200, then the method may fail to identify a wafer 200 at a particular height since the detected object distance at that height would correspond to the distance between the front sensor 3500 and the wafer 200, which is greater than the predetermined distance and therefore the wafer 200 is not detected and the height is not assigned thereto.

In some embodiments, the predetermined distance is greater than the distance by which the end effector 3100 of the robot arm device 3000 extends into the front opening unified pod 100. When the front sensor 3500 is at the same height as an object which the end effector 3100 can contact when extending into the front opening unified pod 100, the object distance is less than the predetermined distance, and said height is assigned to the object. If the predetermined distance is less than the distance by which the end effector 3100 extends into the front opening unified pod 100, then the method may fail to identify an object which the end effector 3100 will impact upon being inserted into the front opening unified pod 100 at a particular height since the detected object distance at that height would correspond to the distance between the front sensor 3500 and said object, which is greater than the predetermined distance and therefore the is not detected and the height is not assigned thereto.

Figure 7C:
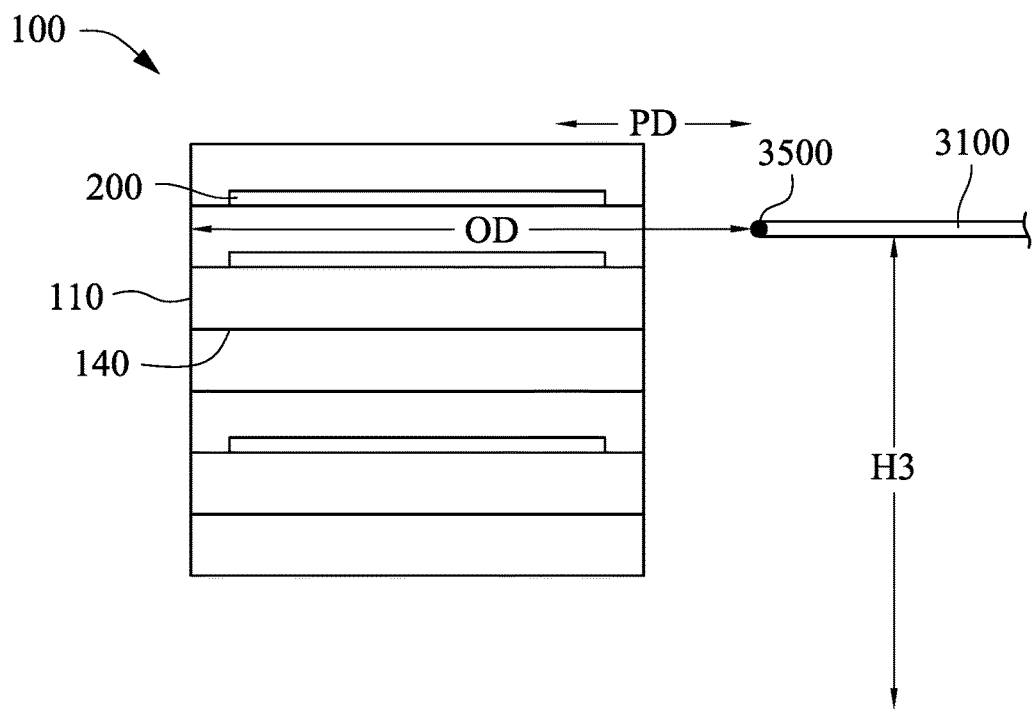

In some embodiments, as shown in FIG. 7C, the predetermined distance PD is less than the distance between the front sensor 3500 and the back wall 110 of the front opening unified pod 100. When no object is between the front sensor 3500 and the back wall 110 of the front opening unified pod 100 at a particular height H3, the object distance is greater than the predetermined distance PD and the height is not assigned to any object. If the predetermined distance is greater than the distance between the front sensor 3500 and the back wall 110 of the front opening unified pod 100, then all heights between the top and the bottom of the front opening unified pod 100 will be assigned to an object since the detected object distance at all heights between the top and the bottom of the front opening unified pod 100 would be less than the predetermined distance.

Figure 8:
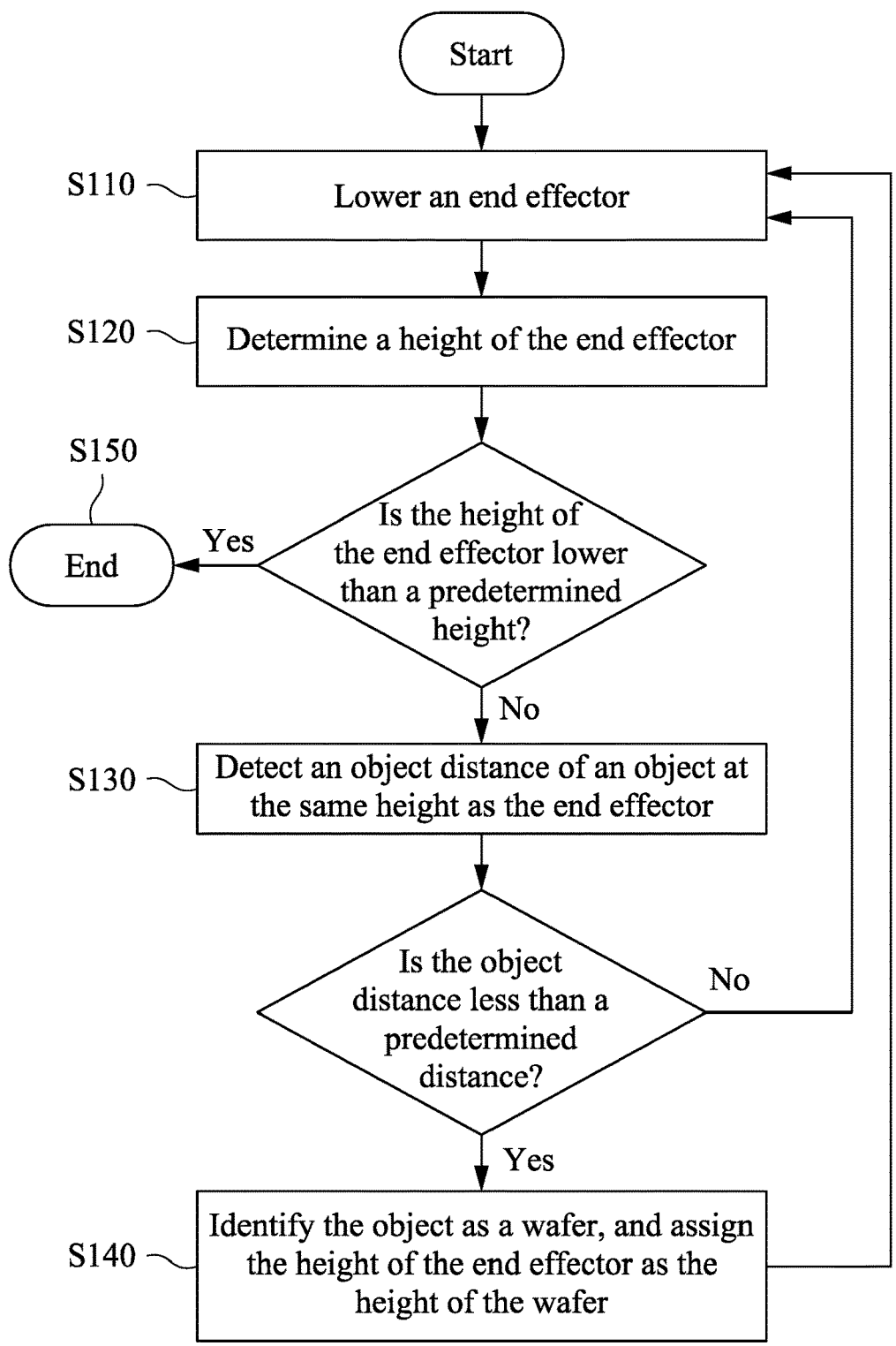
FIG. 8 shows a flowchart of a method for determining heights of wafers in a front opening unified pod according to some embodiments of the present disclosure.

By applying the abovementioned step, the respective heights of the wafers 200 in the front opening unified pod 100 can be identified. FIG. 8 shows a flowchart of a method for determining the heights of the wafers 200 in the front opening unified pod 100. Starting with block S110, an end effector of a robot arm device is lowered. The method continues with block S120, wherein a height of the end effector is determined. If the height of the end effector is lower than a predetermined height, then the method ends at block S150. If the height of the end effector is not lower than a predetermined height, then the method continues with block S130, wherein an object distance in front of the end effector is detected. The object distance is the distance from a front sensor arranged at the front of the end effector of the end effector to an object at the same height and in a direction from the end effector toward the front opening unified pod. If the detected object distance is not less than a predetermined distance, then the process continues with block S110. If the detected object distance is less than a predetermined distance, then the process continues with block S140, wherein the detected object is identified as a wafer, and the height of the end effector is assigned as the height of the wafer. After block S140, the method continues with block S110. After block S150 is completed, the height of each of the wafers in the front opening unified port is identified, such that the end effector can later be positioned at the appropriate height when a specific wafer is to be transferred in a wafer manufacturing process.

Please refer again to FIGS. 7A, 7B, 7C, and 7D for an embodiment of the above method. As shown in FIG. 7A, the front sensor 3500 arranged at the front of the end effector 3100 of the robot arm device is level with the top of the front opening unified pod 100 at height H1. As shown in FIG. 7B, the end effector 3100 and the front sensor 3500 arranged thereon are lowered by an incremental distance, and the front sensor detects an object distance OD in front of front sensor 3500, in a direction from the end effector 3100 toward the front opening unified pod 100. The object distance OD is less than a predetermined distance PD, the object in front of the front sensor 3500 arranged on the end effector 3100 is determined to be a wafer 200, and the present height H2 of the end effector 3100 is assigned as the height of the wafer 200.

As shown in FIG. 7C, the end effector 3100 and the front sensor 3500 arranged thereon is further lowered by an incremental distance, and the front sensor 3500 again detects an object distance OD in front of the front sensor 3500, in the direction from the end effector 3100 toward the front opening unified pod 100. The object distance OD is not less than the predetermined distance PD, and the object in front of the front sensor 3500 arranged on the end effector 3100 is not determined to be a wafer.

Figure 7D:
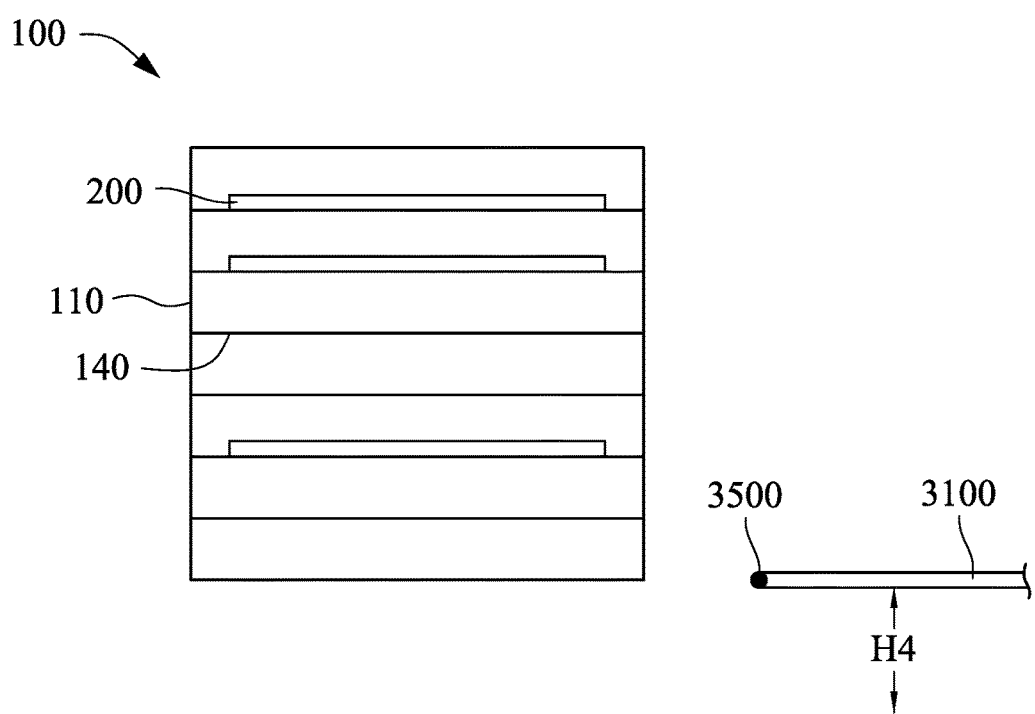

The end effector 3100 is then further lowered by an incremental distance, and the height of the end effector 3100 at the moment is assigned as the height of a detected wafer 200 whenever the detected object distance is less than the predetermined distance. When the end effector 3100 reaches a predetermined height H4 corresponding to the bottom of the front opening unified pod 100 as shown in FIG. 7D, the process ends.

Figure 9:
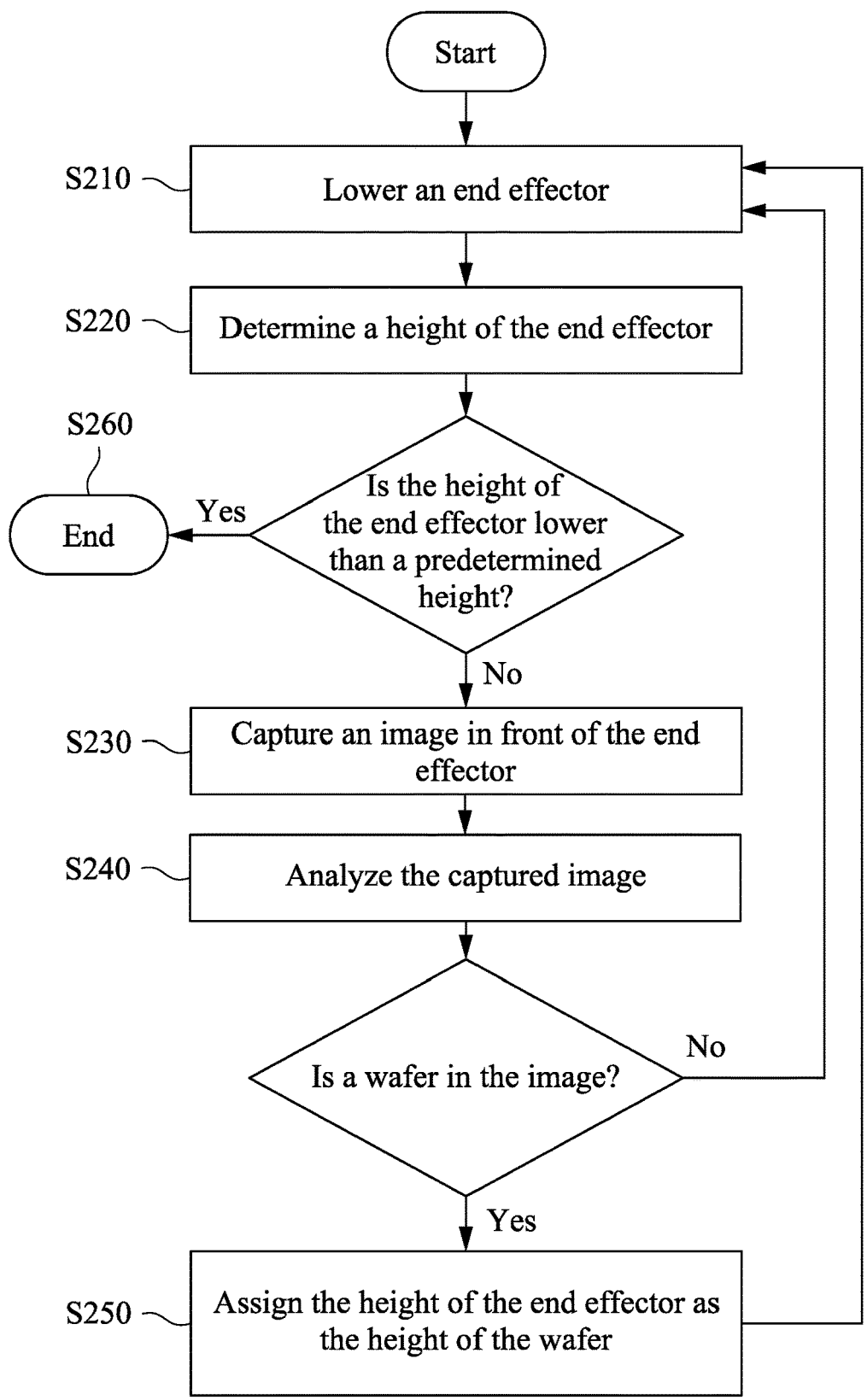
FIG. 9 shows a flowchart of a method for determining heights of wafers in a front opening unified pod according to some embodiments of the present disclosure.

In some embodiments of the present disclosure, the front sensor 3500 is an image sensor for detecting an image in front of the end effector 3100, in a direction from the end effector 3100 toward the front opening unified pod 100. FIG. 9 shows a flowchart of another method for determining the heights of wafers in a front opening unified pod. Starting with block S210, an end effector of a robot arm device is lowered. The method continues with block S220, wherein a height of the end effector is determined. If the height of the end effector is lower than a predetermined height, then the method ends at block S260. If the height of the end effector is not lower than a predetermined height, then the method continues with block S230, wherein an image in front of the end effector is captured. The image is then analyzed to determine if a wafer is in the image in block S240. If not, then the process continues with block S210. If so, then the process continues with block S250, wherein the height of the end effector is assigned as the height of the wafer. After block S250, the method continues with block S210. After block S260 is completed, the height of each of the wafers in the front opening unified port is identified, such that the end effector can later be positioned at the appropriate height when a specific wafer is to be transferred in a wafer manufacturing process.

Figure 10:
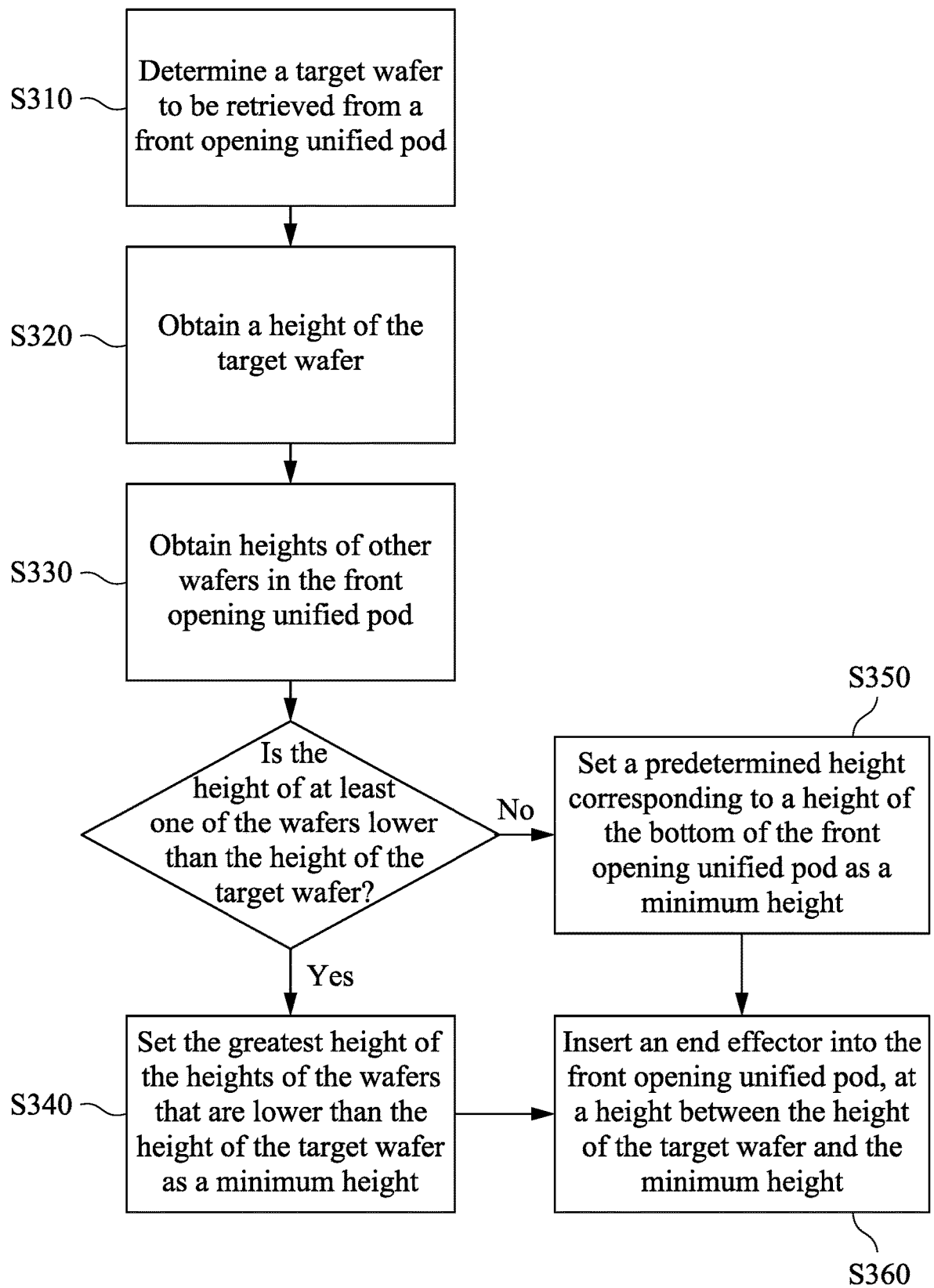
FIG. 10 shows a flowchart of a method for inserting an end effector into a front opening unified pod at an appropriate height according to some embodiments of the present disclosure.

In some embodiments of the present disclosure, after the heights of the wafers in the front opening unified pod is identified, these data can be used when inserting the end effector into the front opening unified pod to retrieve a target wafer. FIG. 10 shows a flowchart of a method for inserting an end effector into a front opening unified pod at an appropriate height when retrieving a wafer. Starting with block S310, a target wafer is determined to be retrieved from a front opening unified pod. The method continues with block S320, wherein a height of the target wafer is obtained. In block S330, heights of other wafers in the front opening unified pod are obtained. The heights of the wafers can be obtained by using the heights identified from the abovementioned methods. If the height of at least one of the wafers is lower than the height of the target wafer, then the method continues with block S340, wherein the greatest height of the heights of the wafers lower than the height of the target wafer is set as a minimum height. If not, then the method continues with S350, wherein a predetermined height corresponding to a height of the bottom of the front opening unified pod is set as a minimum height. After step S340 and step 350, the method continues with block S360 wherein an end effector is inserted, into the front opening unified pod, at a height between the height of the target wafer and the minimum height, as illustrated in FIGS. 6A-6D. As described above, the end effector 3100 is positioned at a height between the assigned heights of the wafers 200 and 200' in FIG. 6A, is horizontally moved into the front opening unified pod 100 in FIG. 6B, is moved upward so as to lift the wafer 200 in FIG. 6C, and retrieves the wafer 200 from the front opening unified pod 100 in FIG. 6D.

In some embodiments of the present disclosure, before the wafer is transferred to a process chamber in a wafer manufacturing process, the wafer is first checked for defects and contamination such that no manufacturing steps are wasted on a defective wafer, and such that contaminants on the wafer does not contaminate a process chamber. The same end effector used for transferring the wafer and for identifying the respective heights of the wafers in the front opening unified pod can also be used for detecting defects and contaminants on the wafer, or specifically on the backside of the wafer.

Figure 11:
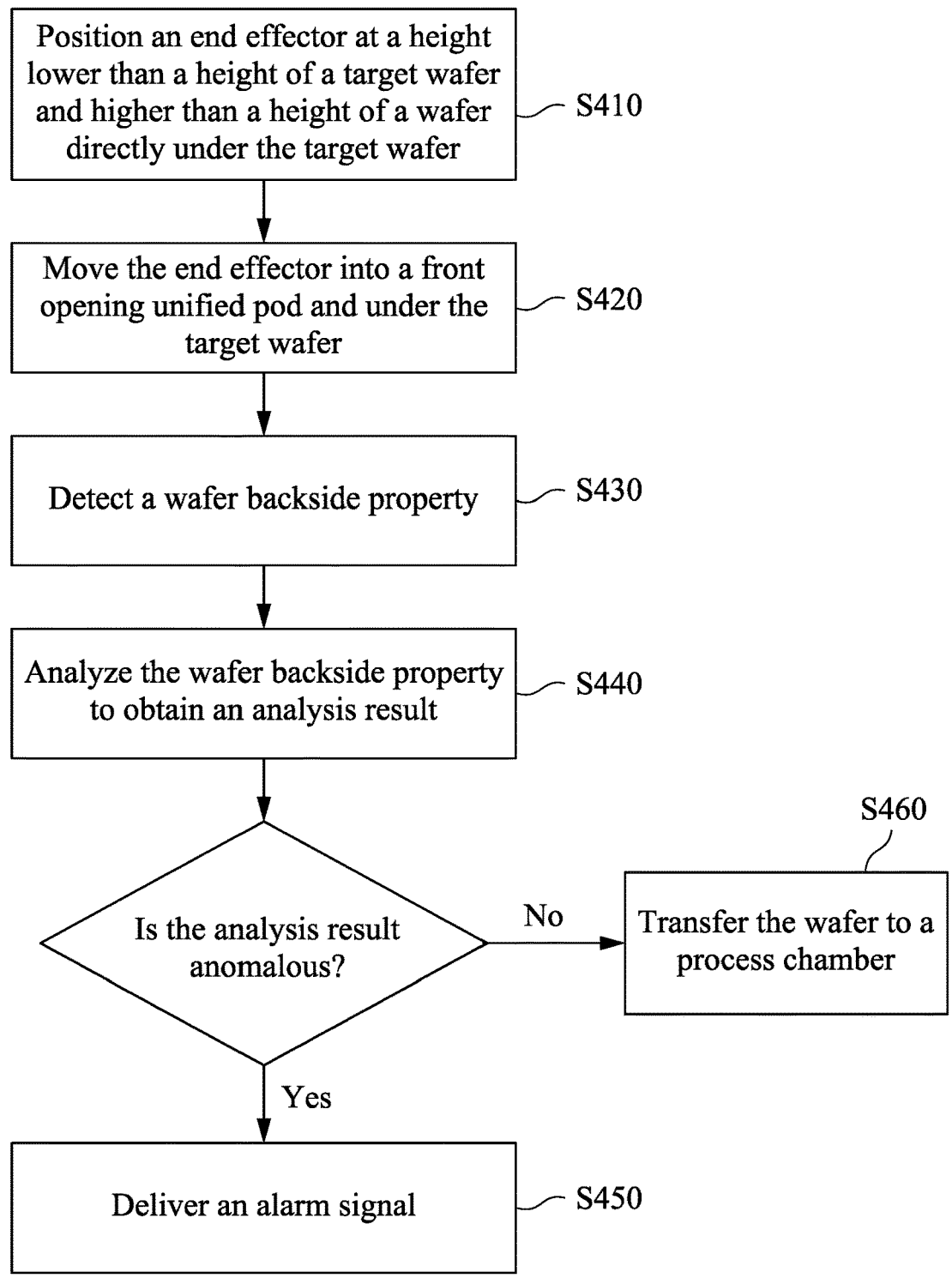
FIG. 11 shows a flowchart of a method for checking a wafer according to some embodiments of the present disclosure.

Referring to FIG. 11, a method for checking a wafer begins with block S410 wherein an end effector is positioned to a height lower than a height of a target wafer and higher than a height of a wafer directly under the target wafer. The heights of the wafers can be obtained via one of the abovementioned methods for determining the heights of wafers in a front opening unified pod. The method for checking a wafer continues with block S420 wherein the end effector is moved into a front opening unified pod and under the target wafer. The method then continues with block S430 wherein a wafer backside property is detected. The method then continues with block S440 wherein the wafer backside property is analyzed to obtain an analysis result. If the analysis result is anomalous, then the method continues with block S450 wherein an alarm signal is delivered. If the analysis result is not anomalous, then the method continues with block S460 wherein the wafer is transferred to a process chamber.

In block S460, transferring the wafer from the front opening unified to the process chamber includes the steps shown in FIGS. 6A-6D. As described above, the end effector 3100 is positioned at a height between the assigned heights of the wafers 200 and 200' in FIG. 6A, is horizontally moved into the front opening unified pod 100 in FIG. 6B, is moved upward so as to lift the wafer 200 in FIG. 6C, and retrieves the wafer 200 from the front opening unified pod 100 in FIG. 6D.

In block S410, the wafers 200 are supported inside the front opening unified pod 100 on the fin supports 140, and are placed with their front side up, and their backside 201 down as shown in FIG. 1. Therefore, in order to detect the wafer backside property of the wafer in block S430, top sensors are disposed at a top surface of the end effector such that the sensor can be directed upward at the backside of the wafer.

In some embodiments, the top sensors are two image cameras disposed at a top surface of the end effector for detecting the two dimension image of the backside of the wafer, and the detected wafer backside property are two dimensional images of the backside of the wafer. The two dimensional image of the wafer can then be analyzed for abnormal color, particles (e.g. contaminants), scratches, cracks, and/or markings.

In some embodiments, the top sensor is a distance detector, and the detected wafer backside property is distances between the top sensor and a plurality of points on the backside of the wafer. The distances can then be analyzed to determine if the backside of the wafer, and therefore the wafer, is flat and planar, or warped. Specifically, a degree of warpage of the wafer can be determined, and if the degree of warpage is above a predetermined threshold, then an anomalous analysis result is obtained.

In some embodiments, the top sensor is an acoustic detector, and the detected wafer backside property is an acoustic property of the wafer. In some embodiments, a sound wave generator disposed on a top face of the end effector is used to generate sound waves, which travel to and hit the backside of the wafer, and is then reflected to the top sensor disposed on the top face of the end effector. Based on the sound waves detected by the top sensor, an analysis result can be obtained for the acoustic property of the wafer. In some embodiments, the sound wave generator generates sound waves. In some embodiments of the present disclosure, the end effector and a sensor arranged thereon is used for checking a wafer chuck or a process chamber. The end effector is moved over the wafer chuck or into the process chamber, and a wafer chuck property or a process chamber property is detected. Then, the wafer chuck property or the process chamber property is analyzed to obtain an analysis result. If the analysis result is anomalous, then an alarm signal is delivered. If the analysis result is not anomalous, then the method continues with normal operation of a wafer manufacturing process.

The present disclosure provides devices and methods for identifying the respective heights of the wafers stored in the front opening unified pod, such that the end effector does not accidentally impact one of the wafers and knock over the front opening unified pod when attempting to retrieve a wafer therefrom. Furthermore, the present disclosure provides devices and methods for identifying anomalous wafer backside property, anomalous process chamber property, anomalous wafer chuck property and the like, such that a defect or contamination can be automatically detected and reported via an alarm signal.

According to some embodiments of the present disclosure, a method includes detecting an object distance of an object in front of an end effector, and assigning a height of the end effector as a height of the object if the detected object distance equal to or less than a predetermined distance.

According to some embodiments of the present disclosure, a method includes positioning an end effector at a height lower than a height of a wafer, moving the end effector to a position under the wafer, detecting a wafer backside property of the wafer by using a top sensor, and analyzing the wafer backside property to obtain an analysis result.

According to some embodiments of the present disclosure, a robot arm device includes an end effector having a top surface, a transmission system, a process controller for controlling the transmission system and the end effector, a top sensor arranged on the top surface of the end effector and configured to detect a wafer backside property, and a micro computer unit configured to analyze the wafer backside property.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   positioning an end effector in front of a front opening unified pod;
   capturing an image of the front opening unified pod by using a front sensor located on the end effector;
   determining a height of a wafer in the front opening unified pod based on the image;
   positioning the end effector at a height lower than the height of the wafer;

moving the end effector to a position under the wafer;
detecting a property on a backside of the wafer by using a detector on the end effector; and
analyzing the property to obtain an analysis result.

2. The method according to claim 1, further comprising: reporting an alarm signal when the analysis result is anomalous.

3. The method according to claim 1, further comprising: transferring the wafer to a process chamber when the analysis result is not anomalous.

4. The method according to claim 1, wherein analyzing the property uses a predetermined algorithm.

5. The method according to claim 4, wherein the predetermined algorithm is built by machine learning.

6. The method according to claim 1, wherein the detector is an acoustic detector.

7. A robot arm device, comprising:
a transmission system;
an end effector mechanically dependent on a motion of the transmission system and having a top surface;
a wafer backside sensor arranged on the top surface of the end effector;
a front sensor arranged on a front sidewall of one of two finger portions of the end effector and operative to detect an object distance from an object in front of said one of two finger portions to the end effector, wherein a sensing direction of the front sensor is in front of the end effector and orthogonal to a sensing direction of the wafer backside sensor; and
a micro computer unit configured to analyze a wafer backside property based on a detecting result from the wafer backside sensor.

8. The robot arm device according to claim 7, wherein the wafer backside sensor comprises two image cameras arranged on the top surface of the end effector.

9. The robot arm device according to claim 8, wherein the two image cameras are arranged on the two finger portions, respectively.

10. The robot arm device according to claim 7, wherein the wafer backside sensor is a distance detector arranged on the top surface of the end effector.

11. The robot arm device according to claim 7, wherein the wafer backside sensor is an acoustic detector.

12. The robot arm device according to claim 7, further comprising a sound wave generator on the end effector.

13. The robot arm device according to claim 7, wherein the front sensor is an image sensor.

14. The robot arm device according to claim 7, wherein the end effector further comprises:
a connecting portion interconnecting the two finger portions, wherein the wafer backside sensor is further arranged on the connecting portion.

15. The robot arm device of claim 11, wherein the end effector further comprises a connecting portion interconnecting the two finger portions, and the acoustic detector is on the connecting portion.

16. The robot arm device according to claim 12, wherein the sound wave generator is on said one of the two finger portions.

17. A method comprising:
positioning an end effector of a robot arm device in front of a front opening unified pod;
capturing an image of the front opening unified pod by using a front sensor located on the end effector;
determining a height of a wafer in the front opening unified pod based on the image;
moving the end effector into the front opening unified pod and under the wafer;
after moving the end effector, obtaining a property of a backside of the wafer by using a sensor mounted on a top surface of the end effector;
obtaining an analysis result of the property of the backside of the wafer by using a computer unit; and
moving the wafer by using the end effector based on the analysis result.

18. The method of claim 17, wherein obtaining the property of the backside of the wafer comprises detecting a distance between the sensor and a point on the backside of the wafer.

19. The method of claim 17, wherein obtaining the analysis result of the property of the backside of the wafer comprises analyzing the backside of the wafer for abnormal color, particles, scratches, cracks, or combinations thereof.

20. The method according to claim 17, wherein moving the wafer comprises moving the wafer to a process chamber.

* * * * *